US 6,579,153 B2

(12) United States Patent
Uchikura et al.

(10) Patent No.: US 6,579,153 B2
(45) Date of Patent: Jun. 17, 2003

(54) AQUEOUS DISPERSION FOR CHEMICAL MECHANICAL POLISHING AND CHEMICAL MECHANICAL POLISHING PROCESS

(75) Inventors: Kazuhito Uchikura, Tokyo (JP); Masayuki Motonari, Tokyo (JP); Masayuki Hattori, Tokyo (JP); Nobuo Kawahashi, Tokyo (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 09/756,193

(22) Filed: Jan. 9, 2001

(65) Prior Publication Data

US 2001/0008828 A1 Jul. 19, 2001

(30) Foreign Application Priority Data

Jan. 12, 2000 (JP) ........................ 2000-003340
Oct. 12, 2000 (JP) ........................ 2000-312134

(51) Int. Cl.$^7$ ............................................ H01L 21/283
(52) U.S. Cl. ........................... 451/41; 438/692; 451/36
(58) Field of Search ............................... 451/41, 36, 37, 451/60; 438/690–693; 51/307–309; 252/79.1, 79.4; 156/345.11, 345.12

(56) References Cited

U.S. PATENT DOCUMENTS

| 6,063,306 A | * | 5/2000 | Kaufman et al. | 216/89 |
| 6,117,783 A | * | 9/2000 | Small et al. | 106/3 |
| 6,217,416 B1 | * | 4/2001 | Kaufman et al. | 451/41 |
| 6,309,560 B1 | * | 10/2001 | Kaufman et al. | 252/79.1 |
| 6,313,039 B1 | * | 11/2001 | Small et al. | 106/3 |
| 6,350,694 B1 | * | 2/2002 | Chang et al. | 438/692 |
| 6,362,106 B1 | * | 3/2002 | Kaufman et al. | 216/89 |
| 6,368,955 B1 | * | 4/2002 | Easter et al. | 438/626 |

FOREIGN PATENT DOCUMENTS

| EP | 0 747 939 | 12/1996 |
| JP | 59-170175 | 9/1984 |

(List continued on next page.)

OTHER PUBLICATIONS

U.S. patent application Ser. No. 09/672,310, filed Sep. 29, 2000, pending.

(List continued on next page.)

*Primary Examiner*—Joseph J. Hail, III
*Assistant Examiner*—David B. Thomas
(74) *Attorney, Agent, or Firm*—Oblon, Spivak, McClelland, Maier & Neustadt, P.C.

(57) ABSTRACT

There are provided aqueous dispersions for CMP that can efficiently polish both copper films and barrier metal films, which can give sufficient flattened finished surfaces without excessive polishing of insulating films, as well as a CMP process employing the aqueous dispersions. The aqueous dispersions for CMP according to the invention are characterized in that for polishing of a copper film, barrier metal film and insulating film under the same conditions, the polishing rate ratio ($R_{Cu}/R_{BM}$) of the copper film ($R_{Cu}$) and the barrier metal film ($R_{BM}$) is such that $0.5 \leq R_{Cu}/R_{BM} \leq 2$, and the polishing rate ratio ($R_{Cu}/R_{In}$) of the copper film ($R_{Cu}$) and the insulating film ($R_{In}$) is such that $0.5 \leq R_{Cu}/R_{In} \leq 2$. Other aqueous dispersions for CMP according to the invention are characterized in that they contain an abrasive, a heterocyclic compound, an organic acid and an oxidizing agent, and for polishing of a copper film, barrier metal film and insulating film under the same conditions, the polishing rate ratio ($R_{Cu}/R_{BM}$) of the copper film ($R_{Cu}$) and the barrier metal film ($R_{BM}$) is such that $0 < R_{Cu}/R_{BM} \leq 5$, and the polishing rate ratio ($R_{In}/R_{BM}$) of the insulating film ($R_{In}$) and the barrier metal film ($R_{BM}$) is such that $0 < R_{In}/R_{BM} \leq 2$. The CMP process of the invention is characterized by using these aqueous dispersions for CMP in the second stage of two-stage polishing, in the second stage of three-stage polishing or in the third stage of three-stage polishing.

33 Claims, 1 Drawing Sheet

U.S. PATENT DOCUMENTS

| | | |
|---|---|---|
| JP | 4-291723 | 10/1992 |
| JP | 8-510437 | 11/1996 |
| JP | 10-044047 | 2/1998 |
| JP | 10-046140 | 2/1998 |
| JP | 10-116804 | 5/1998 |
| JP | 10-270447 | 10/1998 |
| JP | 10-279928 | 10/1998 |
| JP | 11-040526 | 2/1999 |
| JP | 11-135466 | 5/1999 |
| JP | 2000-160139 | 6/2000 |
| WO | WO 99/64527 | 12/1999 |
| WO | WO 00/00561 | 1/2000 |

OTHER PUBLICATIONS

U.S. patent application Ser. No. 09/778,817, filed Feb. 8, 2001, pending.

U.S. patent application Ser. No. 09/716,384, filed Nov. 21, 2000, pending.

U.S. patent application Ser. No. 09/756,193, filed Jan. 9, 2001, pending.

U.S. patent application Ser. No. 09/820,749, filed Mar. 30, 2001, pending.

U.S. patent application Ser. No. 09/816,397, filed Mar. 26, 2001, pending.

U.S. patent application Ser. No. 09/756,193, filed Jan. 9, 2001, pending.

* cited by examiner

AQUEOUS DISPERSION FOR CHEMICAL MECHANICAL POLISHING AND CHEMICAL MECHANICAL POLISHING PROCESS

BACKGROUND OF THE INVENTION

1. Field of the Invention

The present invention relates to an aqueous dispersion for chemical mechanical polishing (hereunder referred to as "aqueous dispersion") and to a chemical mechanical polishing process. More specifically, the invention relates to an aqueous dispersion capable of efficient polishing of various types of working films formed on semiconductor substrates, which allows free adjustment of the polishing rate ratios for copper films, barrier metal films and insulating films, and which can give adequately flattened and high precision finished surfaces, as well as to a chemical mechanical polishing process employing the aqueous dispersion. The aqueous dispersion of the invention is particularly useful for the second-stage chemical mechanical polishing step of two-stage polishing processes, or for the second-stage or third-stage chemical mechanical polishing step of three-stage polishing processes.

2. Description of the Prior Art

A recent technique used in the manufacture of semiconductor devices is a process whereby a hole or groove is formed in an insulating film on a processing wafer, and then a barrier metal film made of a hard metal or the like is formed and a wiring material such as tungsten, aluminum or copper is embedded in the hole or groove to form a wiring material film, after which the unnecessary portions of the wiring material film and barrier metal film are removed by chemical mechanical polishing (hereunder referred to as "CMP") to complete the wiring. The wiring formed by this technique is known as damascene wiring.

It is common to form damascene wiring by a CMP process comprising a plurality of CMP steps.

For example, in a CMP process comprising two CMP steps (hereunder referred to as "two-stage polishing process"), the wiring material such as copper is polished mainly in the first-stage CMP step, and the barrier metal film is polished mainly in the second-stage CMP step. Several forms of the two-stage polishing process have been proposed, and a great number of aqueous dispersions for use in each stage have also been proposed.

First two-stage polishing process involves polishing in the first-stage CMP step until the copper is almost completely removed, and then removing just the barrier metal film in the second-stage CMP step. In this case, dishing often occurs in the wiring sections during the first-stage CMP step, and this dishing cannot be corrected by the second-stage CMP step in which mainly the barrier metal film is polished, and therefore it is sometimes difficult to form satisfactory damascene wiring.

Second two-stage polishing process that has been proposed involves incomplete removal of the copper in the first-stage CMP step to an extent that does not cause dishing in the wiring sections, and removal of the copper remaining from the first-stage CMP step with the barrier metal film in the second-stage CMP step. This process sometimes results in inadequate smoothness of the finished surface, and requires a longer time to complete the polishing, thus also leading to the problem of increased costs.

In the first and second processes mentioned above, different polishing performance is required for the aqueous dispersions used in the second-stage CMP step, and therefore different aqueous dispersions with different component contents are used for the second stages, respectively.

In manufacturing processes for semiconductor devices, insufficient flatness of the underlayer wiring can cause unwanted irregularities on the surface of the insulating film, and the copper film and barrier metal film formed over those irregularities often create "waviness". As a measure against such situations, it has been proposed to employ a polishing process with three CMP steps (hereunder referred to as "three-stage polishing process") in order to eliminate the waviness and obtain a flatter finished surface. The third-stage CMP step uses an aqueous dispersion whose components and composition are suited for that step.

In the various CMP steps described above, however, it is not easy to accomplish efficient polishing of barrier metal films made of metals with high hardness, such as tantalum. On the other hand, since copper films are relatively soft they are easy to polish and can produce dishing, sometimes preventing a flat finished surface. Wiring breaks also sometimes occur due to scratching and the like.

When the polishing surface is a porous insulating film with a low dielectric constant, it is difficult to achieve an adequate polishing rate if an aqueous dispersion with a low pH is used for the CMP, and conversely if the pH is high, the insulating film is excessively polished making it difficult to form satisfactory damascene wiring. It also becomes difficult to prevent scratches during the CMP of porous insulating films with low dielectric constants.

SUMMARY OF THE INVENTION

[Problems to be Solved by the Invention]

It is an object of the present invention to provide an aqueous dispersion for chemical mechanical polishing that can give sufficiently flattened and highly precise finished surfaces and can form satisfactory damascene wiring, as well as a chemical mechanical polishing process employing the aqueous dispersion.

It is another object of the invention to provide an aqueous dispersion for chemical mechanical polishing that can efficiently polish both copper films and barrier metal films, which can give sufficient flattened finished surfaces without excessive polishing of insulating films, and which can form satisfactory damascene wiring, as well as a chemical mechanical polishing process employing the aqueous dispersion.

[Features of the Invention]

We studied polishing of working films formed on semiconductor substrates with the object of obtaining an aqueous dispersion for chemical mechanical polishing capable of sufficiently flattening finished surfaces.

As a result, it was discovered that finished surfaces which are sufficiently flattened with high precision can be obtained by polishing of a copper film, barrier metal film and an insulating film under the same conditions if the aqueous dispersion used for the CMP has a specific value for the polishing rate ratio for each film.

It was further discovered that by using an aqueous dispersion with a specific composition containing a heterocyclic compound, an organic acid, an oxidizing agent and if necessary a surfactant, it is possible to easily adjust the polishing rate ratios for the copper film, barrier metal film and insulating film, and to efficiently polish the copper film and barrier metal film while giving a sufficiently flattened and highly precise finished surface with no excessive polishing of the insulating film.

The present invention has been accomplished on the basis of these discoveries.

In other words, the aforementioned problems are solved by the present invention which provides an aqueous dispersion for chemical mechanical polishing and a chemical mechanical polishing process having following constitutions.

[1] An aqueous dispersion for chemical mechanical polishing characterized in that, for polishing of a copper film, barrier metal film and insulating film under the same conditions, the ratio ($R_{Cu}/R_{BM}$) of the polishing rate for said copper film ($R_{Cu}$) and the polishing rate for said barrier metal film ($R_{BM}$) is such that $0.5 \leq R_{Cu}/R_{BM} \leq 2$, and the ratio ($R_{Cu}/R_{In}$) of the polishing rate for said copper film ($R_{Cu}$) and the polishing rate for said insulating film ($R_{In}$) is such that $0.5 \leq R_{Cu}/R_{In} \leq 2$.

[2] An aqueous dispersion for chemical mechanical polishing according to [1] above, wherein said barrier metal film is composed of tantalum and/or tantalum nitride.

[3] An aqueous dispersion for chemical mechanical polishing according to [1] above, which contains at least an abrasive, water and a polishing rate adjusting component.

[4] An aqueous dispersion for chemical mechanical polishing according to [3] above, wherein said abrasive consists of at least one type of particles selected from among inorganic particles, organic particles and inorganic/organic composite particles.

[5] An aqueous dispersion for chemical mechanical polishing according to [3] above, wherein said polishing rate adjusting component is maleic acid ion.

[6] An aqueous dispersion for chemical mechanical polishing according to [5] above, wherein the concentration of said maleic acid ion is 0.005–1 mole/liter.

[7] An aqueous dispersion for chemical mechanical polishing according to [1] above, wherein the pH is 7–11.

[8] An aqueous dispersion for chemical mechanical polishing characterized in that it contains an abrasive, a heterocyclic compound, an organic acid and an oxidizing agent, and for polishing of a copper film, barrier metal film and insulating film under the same conditions, the ratio ($R_{Cu}/R_{BM}$) of the polishing rate for said copper film ($R_{Cu}$) and the polishing rate for said barrier metal film ($R_{BM}$) is such that $0 < R_{Cu}/R_{BM} \leq 5$, and the ratio ($R_{In}/R_{BM}$) of the polishing rate for said insulating film ($R_{In}$) and the polishing rate for said barrier metal film $R_{BM}$ is such that $0 < R_{In}/R_{BM} \leq 2$.

[9] An aqueous dispersion for chemical mechanical polishing according to [8] above, which further contains a surfactant at 0.0001–0.1 wt %.

[10] An aqueous dispersion for chemical mechanical polishing according to [8] above, wherein the pH is below 8.5, said ratio $R_{Cu}/R_{BM}$ is such that $0.5 < R_{Cu}/R_{BM} \leq 5$, and said ratio $R_{In}/R_{BM}$ is such that $0 < R_{In}/R_{BM} \leq 0.1$.

[11] An aqueous dispersion for chemical mechanical polishing according to [10] above, wherein said heterocyclic compound is either or both quinaldinic acid or 7-hydroxy-5-methyl-1,3,4-triazaindolizine.

[12] An aqueous dispersion for chemical mechanical polishing according to [10] above, which further contains a surfactant at 0.0001–0.1 wt %.

[13] An aqueous dispersion for chemical mechanical polishing according to [8] above, wherein the pH is 8.5 or above, said ratio $R_{Cu}/R_{BM}$ is such that $0 < R_{Cu}/R_{BM} \leq 0.1$, said ratio $R_{In}/R_{BM}$ is such that $0 < R_{In}/R_{BM} \leq 0.1$, and which further contains a surfactant at 0.0001–0.1 wt %.

[14] An aqueous dispersion for chemical mechanical polishing according to [13] above, wherein said heterocyclic compound is benzotriazole.

[15] An aqueous dispersion for chemical mechanical polishing according to [8] above, wherein the pH is 8.5 or above, said ratio $R_{Cu}/R_{BM}$ is such that $0 < R_{Cu}/R_{BM} \leq 0.05$, and said ratio $R_{In}/R_{BM}$ is such that $0.1 < R_{In}/R_{BM} \leq 2$.

[16] An aqueous dispersion for chemical mechanical polishing according to [15] above, wherein said heterocyclic compound is at least one from among benzotriazole, quinaldinic acid and 7-hydroxy-5-methyl-1,3,4-triazaindolizine.

[17] A chemical mechanical polishing process characterized by comprising a first stage of chemical mechanical polishing which employs an aqueous dispersion for chemical mechanical polishing with a ratio ($R_{Cu}/R_{BM}$) of the polishing rate for copper films ($R_{Cu}$) and the polishing rate for barrier metal films ($R_{BM}$) of 20 or greater, and a second stage of chemical mechanical polishing which employs an aqueous dispersion for chemical mechanical polishing according to any one of [1] to [7] above.

[18] A chemical mechanical polishing process characterized in that the second stage of chemical mechanical polishing of a polishing process comprising two stages of chemical mechanical polishing is carried out using an aqueous dispersion for chemical mechanical polishing according to any one of [10] to [16] above.

[19] A chemical mechanical polishing process characterized in that the second stage of chemical mechanical polishing of a polishing process comprising three stages of chemical mechanical polishing is carried out using an aqueous dispersion for chemical mechanical polishing according to any one of [10] to [12] above.

[20] A chemical mechanical polishing process characterized in that the third stage of chemical mechanical polishing of a polishing process comprising three stages of chemical mechanical polishing is carried out using an aqueous dispersion for chemical mechanical polishing according to any one of [13] to [16] above.

[Effect of the Invention]

The aqueous dispersion of the invention according to claims 1 to 7 has a specific ratio between the polishing rates for copper films and barrier metal films and a specific ratio between the polishing rates for copper films and insulating films, thus allowing working films to be polished to the same degree at suitable rates while producing no scratches or dishing, so that the dispersion is useful for manufacture of semiconductor devices.

According to the CMP process of the invention as described in claim 17, an aqueous dispersion according to the invention as described in any of claims 1 to 7 is used to obtain finished surfaces with sufficient flatness and high precision.

According to the aqueous dispersion of the invention as described in claims 8 to 16, the composition of the aqueous dispersion may be changed to allow easy adjustment of the polishing rate ratio between the copper film, barrier metal film and insulating film. This allows the barrier metal film to be polished with adequate efficiency, and offers an aqueous dispersion for CMP that does not excessively polish the insulating film. The aqueous dispersion, as described in claims 18 to 20, is useful for the second stage of a two-stage polishing process, or for the second stage or third stage of a three-stage polishing process in the manufacture of semiconductor devices.

Such easy adjustment of the polishing rate ratio by changing the composition is preferred because it requires no complicated apparatuses or complex procedures at the aqueous dispersion supply end. It is also preferred because the demand end only needs to store the suitable and necessary amounts of aqueous dispersions for each polishing, and the storage volume can therefore be reduced.

DETAILED DESCRIPTION OF THE INVENTION

Figure 1:
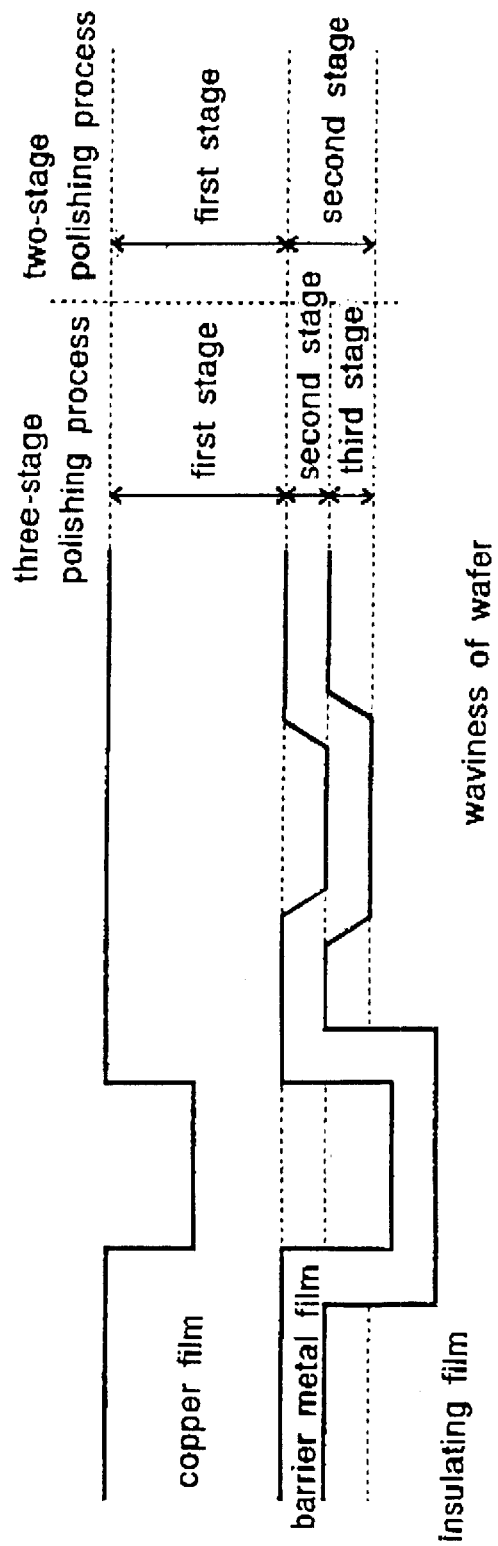
FIG. 1 is a model illustration showing the polishing sections removed during each stage for elimination of wafer waviness by a two-stage polishing process and a three-stage polishing process.

The "copper film" may be formed from pure copper, or it may be formed from an alloy containing at least 95 wt %, such as copper-silicon or copper-aluminum.

The "barrier metal film" is formed from a metal with high hardness such as tantalum or titanium, or from their nitrides, oxides, and the like. Here, a "metal such as tantalum" is not limited to pure tantalum, but includes alloys containing tantalum such as tantalum-niobium. Nitrides of tantalum or titanium (tantalum nitride, titanium nitride) are also not limited to pure products, and for example, they may contain other metal nitrides. Particularly preferred as barrier metal films are tantalum films and/or tantalum nitride films.

The barrier metal film will usually be formed of just one from among metals such as tantalum and titanium or their nitrides, oxides, and the like, but barrier metal films composed of two different compositions, for example, a barrier metal film composed of tantalum and a barrier metal film composed of tantalum nitride, may also be used together on the same substrate.

The "insulating film" may be not only an ordinary $SiO_2$ film, but also a thermal oxidation film such as plasma TEOS, or an insulating film with a low dielectric constant for the purpose of enhancing performance of a VLSI. As "insulating films with a low dielectric constant" there may be used insulation films comprising silsesquioxane (dielectric constant: approximately 2.6–3.0), fluorine-containing $SiO_2$ (dielectric constant: approximately 3.3–3.5), polyimide-based resins (dielectric constant: approximately 2.4–3.6, trade name "PIQ" by Hitachi Chemical Industries Co., Ltd.; trade name "FLARE" by Allied Signal Corp., and the like), benzocyclobutene (dielectric constant: approximately 2.7, trade name "BCB" by Dow Chemical Corp., and the like), hydrogen-containing SOG (dielectric constant: approximately 2.5–3.5) and organic SOG (dielectric constant: approximately 2.9, trade name "HSGR7" by Hitachi Chemical Industries Co., Ltd.) and the like.

"Same conditions" means that a specific model of polishing apparatus is used, and that all of the conditions that affect the polishing results, such as the table and head rotation, polishing pressure, polishing time, type of polishing pad used and supply rate of aqueous dispersion per unit time, are the same.

These conditions may be set as appropriate so long as the comparison is made under the same conditions, but they are preferably actual polishing conditions or nearly actual conditions. For example, it is possible to apply a table rotation speed of 30–120 rpm and preferably 40–100 rpm, a head rotation speed of 30–120 rpm and preferably 40–100 rpm, a table rotation speed/head rotation speed ratio of 0.5–2 and preferably 0.7–1.5, a polishing pressure of 100–500 g/cm² and preferably 200–350 g/cm², and an aqueous dispersion supply rate of 50–300 ml/min and preferably 100–200 ml/min.

The "ratio" of the polishing rates may be calculated from the values of the polishing rates of the copper film, barrier metal film and insulating film when they are separately polished under the aforementioned same conditions. The polishing may be accomplished using a wafer provided with a copper film, barrier metal film and insulating film.

In an aqueous dispersion as described in claims 1 to 7, the ratio ($R_{Cu}/R_{BM}$) of the copper film polishing rate ($R_{Cu}$) and barrier metal film polishing rate ($R_{BM}$) is such that $0.5 \leq R_{Cu}/R_{BM} \leq 2$. The ratio ($R_{Cu}/R_{BM}$) is preferably such that $0.7 \leq R_{Cu}/R_{BM} \leq 1.5$, more preferably such that $0.8 \leq R_{Cu}/R_{BM} \leq 1.2$, and even more preferably $0.9 \leq R_{Cu}/R_{BM} \leq 1.1$. If the ratio ($R_{Cu}/R_{BM}$) is less than 0.5 the copper film may not be polished at a sufficient rate, and when the copper film at the sections other than the grooves or holes (the sections forming the wiring) has been incompletely removed by the first stage of polishing in a two-stage polishing process, a longer time is necessary to remove the unnecessary copper film in the second stage of polishing. On the other hand, if ($R_{Cu}/R_{BM}$) is greater than 2, the copper film may be excessively polished during the second stage of polishing, becoming a source of dishing and making it impossible to form satisfactory damascene wiring.

In an aqueous dispersion as described in claims 1 to 7, the ratio ($R_{Cu}/R_{In}$) of the copper film polishing rate ($R_{Cu}$) and insulating film polishing rate ($R_{In}$) is such that $0.5 \leq R_{Cu}/R_{In} \leq 2$. The ratio ($R_{Cu}/R_{In}$) is preferably such that $0.7 \leq R_{Cu}/R_{In} \leq 1.5$, more preferably such that $0.8 \leq R_{Cu}/R_{In} \leq 1.2$, and even more preferably $0.9 \leq R_{Cu}/R_{In} \leq 1.1$. If the ratio ($R_{Cu}/R_{In}$) is greater than 2 the copper film may be excessively polished when the aqueous dispersion is used for polishing of a working film on a semiconductor substrate, resulting in dishing at the wiring sections and making it impossible to obtain a finished surface with sufficient flatness and high precision. On the other hand, if $R_{Cu}/R_{In}$ is less than 0.5, the insulating film may be excessively polished, making it impossible to form satisfactory damascene wiring.

An aqueous dispersion as described in claims 1 to 7 is useful as an aqueous dispersion to be used for the second stage of polishing in a damascene wiring-forming step. It is also particularly useful for the second stage of polishing in a two-stage polishing process using an aqueous dispersion wherein $R_{Cu}/R_{BM}$ is 20 or greater (more preferably 40 or greater, and even more preferably 50 or greater), as in the CMP process described in claim 17.

When an aqueous dispersion of the invention is used in a one-stage polishing process and/or in the first stage of a two-stage polishing process, there are sometimes economical disadvantages because of the time required for polishing and the need for large amounts of the aqueous dispersion. In the CMP process described in claim 17, the ratio $R_{Cu}/R_{BM}$ of the aqueous dispersion used for polishing in the first step is preferably not less than 20, because this may require more time for polishing in the first step and may necessitate a greater amount of aqueous dispersion.

For an aqueous dispersion as described in claims 8 to 16, the ratio ($R_{Cu}/R_{BM}$) of the copper film polishing rate ($R_{Cu}$)

and barrier metal film polishing rate ($R_{BM}$) is such that $0<R_{Cu}/R_{BM}\leq 5$.

An aqueous dispersion according to claim 10, with a pH of below 8.5, an $R_{Cu}/R_{BM}$ ratio such that $0.5<R_{Cu}/R_{BM}\leq 5$ and an $R_{In}/R_{BM}$ ratio such that $0<R_{In}/R_{BM}\leq 0.1$ [hereunder referred to as "aqueous dispersion (a)"], is particularly effective when used in the second stage of a two-stage polishing process or the second stage of a three-stage polishing process, as according to claims 18 and 19. The $R_{Cu}/R_{BM}$ ratio of aqueous dispersion (a) may be such that $0.5<R_{Cu}/R_{BM}\leq 3$, or such that $0.5<R_{Cu}/R_{BM}\leq 2$. The $R_{In}/R_{BM}$ ratio may be such that $0<R_{In}/R_{BM}\leq 0.09$, or such that $0<R_{In}/R_{BM}\leq 0.085$. By using aqueous dispersion (a), the copper film is polished while the barrier metal film is also adequately polished, with no excessive polishing of the insulating film.

An aqueous dispersion according to claim 13, with a pH of 8.5 or above, an $R_{Cu}/R_{BM}$ ratio such that $0<R_{Cu}/R_{BM}\leq 0.1$, an $R_{In}/R_{BM}$ ratio such that $0<R_{In}/R_{BM}\leq 0.1$, and containing a surfactant at 0.0001–0.1 wt % [hereunder referred to as "aqueous dispersion (b)"], is particularly effective when used in the second stage of a two-stage polishing process or the third stage of a three-stage polishing process, as according to claims 18 and 20. The $R_{Cu}/R_{BM}$ ratio of aqueous dispersion (b) may be such that $0<R_{Cu}/R_{BM}\leq 0.08$, or such that $0<R_{Cu}/R_{BM}\leq 0.05$. The $R_{In}/R_{BM}$ ratio may be such that $0<R_{In}/R_{BM}\leq 0.09$, or such that $0<R_{In}/R_{BM}\leq 0.085$. By using aqueous dispersion (b), the copper film is only slightly polished while the barrier metal film is adequately polished, with no excessive polishing of the insulating film.

An aqueous dispersion according to claim 15, with a pH of 8.5 or above, an $R_{Cu}/R_{BM}$ ratio such that $0<R_{Cu}/R_{BM}\leq 0.05$ and an $R_{In}/R_{BM}$ ratio such that $0.1<R_{In}/R_{BM}\leq 2$ [hereunder referred to as "aqueous dispersion (c)"], is particularly effective when used in the second stage of a two-stage polishing process or the third stage of a three-stage polishing process, as according to claims 18 and 20. The $R_{Cu}/R_{BM}$ ratio of aqueous dispersion (c) may be such that $0<R_{Cu}/R_{BM}\leq 0.03$, or such that $0<R_{Cu}/R_{BM}\leq 0.02$. The $R_{In}/R_{BM}$ ratio may be such that $0.1<R_{In}/R_{BM}\leq 1.5$, or such that $0.1<R_{In}/R_{BM}\leq 0.8$. By using aqueous dispersion (c), there is almost no polishing of the copper film, the barrier metal film is adequately polished, and the insulating film is suitably polished to eliminate waviness.

These aqueous dispersions (a), (b) and (c) may be appropriately selected for use based on whether the copper film has been completely removed in the first stage of polishing or the second stage of polishing has been carried out without completion of the copper film polishing in the first stage of polishing, or on the presence and extent of waviness.

FIG. 1 shows a model illustration of the difference in the polished sections at each step in two-stage polishing and three-stage polishing, where waviness have been produced on the wafer.

The "abrasive" used is preferably of at least one type of particle selected from among inorganic particles, organic particles and inorganic/organic composite particles. Inorganic particles are preferred, with silica particles and especially colloidal silica particles being most preferred for the abrasive.

"Inorganic particles" may be particles composed of silica, alumina, titania, zirconia, ceria or the like. The inorganic particles are preferably of high purity. Specifically, there may be mentioned particles composed of silica, alumina, titania or the like which are synthesized by (1) a fumed method in which oxygen and hydrogen are reacted with silicon chloride, aluminum chloride or titanium chloride in a gas phase, (2) a sol-gel method in which a metal alkoxide such as tetraethoxysilane or a titanium alkoxide is hydrolyzed and condensation is carried out for the synthesis, and (3) an inorganic colloid method in which the impurities are removed by purification.

"Organic particles" may be particles composed of a thermoplastic resin such as any of those listed as (1) to (4) below.

(1) Polystyrene and styrene-based copolymers (2) (Meth)acrylic resins such as polymethyl methacrylate and (meth)acrylic copolymers (3) Polyvinyl alcohol, polyacetal, saturated polyester, polyamide, polyimide, polycarbonate and phenoxy resins (4) Polyolefins such as polyethylene, polypropylene, poly-1-butene and poly-4-methyl-1-pentene, and olefin-based copolymers These organic particles may be produced by emulsion polymerization, suspension polymerization, emulsifying dispersion, pulverization, and the like.

The organic particles may be composed of a polymer with a crosslinked structure, obtained by copolymerization of styrene, methyl methacrylate or the like with divinyl benzene, ethyleneglycol dimethacrylate or the like. The hardness of the organic particles can be adjusted by the degree of crosslinking.

There may also be used organic particles composed of thermosetting resins such as phenol resins, urethane resins, urea resins, melamine resins, epoxy resins, alkyd resins and unsaturated polyester resins.

These different types of inorganic particles and organic particles may be used alone or in combinations of two or more types.

"Inorganic/organic composite particles" may consist of inorganic particles and organic particles formed integrally to an extent so as not to easily separate during the CMP process, and there are no particular restrictions on their types or structures.

As inorganic/organic composite particles (hereunder referred to as "composite particles") there may be used particles formed by polycondensation of an alkoxysilane, aluminum alkoxide, titanium alkoxide or the like in the presence of polymer particles of polystyrene, polymethyl methacrylate or the like, and bonding of polysiloxane or the like on at least the surface of the polymer particles. The resulting polycondensate may be directly bonded to the functional group of the polymer particles, or it may be bonded via a silane coupling agent or the like.

For production of the composite particles, silica particles or alumina particles may also be used instead of an alkoxysilane. These may also be held by intertwining with the polysiloxane, and they may also be chemically bonded to the polymer particles by their functional groups, such as hydroxyl groups.

Composite particles may be the particles composed of organic particles and inorganic particles bonded by electrostatic force, which are formed from an aqueous dispersion containing organic particles and inorganic particles with zeta potentials of opposite signs.

Composite particles composed of electrostatically bonded inorganic particles and organic particles will now be explained further.

The zeta potentials of inorganic particles are highly pH-dependent and have an isoelectric point at which the potential is zero; the sign of the zeta potential reverses at around that point.

On the other hand, the zeta potentials of organic particles are usually negative across the entire pH range, or across a wide pH range except for the low pH range; however, by using organic particles with carboxyl groups, sulfonic acid groups or the like, it is possible to obtain organic particles with a more definite negative zeta potential. Organic particles with amino groups and the like have a positive zeta potential in specific pH ranges.

Thus, by combining specific inorganic particles and organic particles and mixing them in a pH range at which their zeta potentials are of opposite signs, it is possible to form an integral composite of the inorganic particles and organic particles by electrostatic force. During the mixing, the zeta potentials may be of the same sign, and the pH adjusted thereafter so that the zeta potentials of the inorganic particles and organic particles are of opposite signs, thereby allowing integration of the inorganic particles and organic particles.

The inorganic/organic composite particles used may be prepared by polycondensation of an alkoxysilane, aluminum alkoxide, titanium alkoxide or the like in the presence of particles integrally composed in this manner by electrostatic force, and bonding of polysiloxane or the like on at least the surface of the particles to form a composite.

The form of the inorganic particles, organic particles and composite particles acting as the abrasive is preferably spherical. Here, "spherical" means roughly spherical with no acute angle portions, and not necessarily near-perfect spheres. Using a spherical abrasive will allow polishing at an adequate rate, with no scratching of the polishing surface during polishing.

The mean particle size of the abrasive used for the aqueous dispersion of the present invention is preferably 0.001–30 $\mu$m. A mean particle size of less than 0.001 $\mu$m will sometimes prevent an adequately high polishing rate for a CMP process employing the aqueous dispersion. On the other hand, a mean particle size of greater than 30 $\mu$m may result in precipitation and separation of the abrasive, hampering efforts to achieve a stable aqueous dispersion. The mean particle size is preferably 0.002–3 $\mu$m, more preferably 0.005–1 $\mu$m and even more preferably 0.007–1 $\mu$m, and especially 0.01–0.7 $\mu$m. An abrasive with a mean particle size in this range can give a stable aqueous dispersion for CMP that has a high polishing rate without precipitation and separation of the particles. The mean particle size may be measured by observation using a laser diffusion diffraction measuring instrument or a transmission electron microscope.

The abrasive content may be 0.01–30 wt %, with respect to the aqueous dispersion at 100 wt %.

For the aqueous dispersions described in claims 1 to 7, the content is preferably 0.05–30 wt %, more preferably 0.1–20 wt %, even more preferably 0.5–10 wt %, and especially 1–7 wt %.

For aqueous dispersions (a) and (b), the abrasive content is preferably 0.01–15 wt %, more preferably 0.1–5 wt %, and even more preferably 0.3–3 wt %. For aqueous dispersion (c), it is preferably 0.01–15 wt %, more preferably 0.5–10 wt % and even more preferably 1–8 wt %. If the abrasive content is too low, it may not be possible to achieve an adequate polishing rate with the aqueous dispersion. On the other hand, if the abrasive content is too high, the cost is increased and the stability of the aqueous dispersion is undesirably lowered.

The medium for the aqueous dispersion may be water or a mixture composed mainly of water (for example, a mixture of water and methanol). Water is most particularly preferred as the medium for the aqueous dispersion of the invention.

The aqueous dispersions described in claims 1 to 7 may also contain a "polishing rate adjusting component" as described in claim 3 in order to obtain the specified polishing rate ratio. Organic acids may be mentioned as polishing rate adjusting components, and the organic acids may be selected from within a wide range including monobasic acids, dibasic acids, hydroxyl acids, carboxylate acids, chelated acids and non-chelated acids. As preferred organic acids there may be mentioned acetic acid, adipic acid, butyric acid, capric acid, caproic acid, caprylic acid, citric acid, glutaric acid, glycolic acid, formic acid, fumaric acid, lactic acid, lauric acid, malic acid, maleic acid, malonic acid, myristic acid, oxalic acid, palmitic acid, phthalic acid, propionic acid, pyruvic acid, stearic acid, succinic acid, tartaric acid, valeric acid and the like, any one or more of which may be used.

The dissociating portions of these organic acids may be either dissociated or non-dissociated in the aqueous dispersion. When the organic acid is a polyvalent acid such as a divalent or greater acid, the organic acid may be dissociated as a monovalent ion or it may be as a divalent or greater ion. The cation in the dissociating portion which forms a pair with the organic acid ion may be a hydrogen ion, or it may be a cation derived from an additive added to the aqueous dispersion if necessary (for example, ammonium ion, potassium ion, and the like). For preparation of the aqueous dispersion of the invention, the organic acid may be added as an acid or as an organic acid salt.

Maleic acid is particularly preferred among the aforementioned organic acids as the polishing rate adjusting component used for the aqueous dispersions described in claims 1 to 7.

Maleic acid dissociates substantially in its total amount in aqueous dispersions. The cation forming the pair with the maleic acid ion may be hydrogen ion, or it may be a cation derived from an additive added to the aqueous dispersion if necessary (for example, ammonium ion or potassium ion), and potassium ion is preferred. The potassium ion also has an effect of improving the polishing rate, and it can give the aqueous dispersion an even greater polishing rate.

For production of the maleic acid ion and potassium ion, it is most convenient and effective to use potassium maleate. The potassium ion used in the aqueous dispersion may be produced from potassium maleate, produced from potassium hydroxide used for adjustment of the pH of the aqueous dispersion, or derived from an additive added to the aqueous dispersion if necessary.

The maleic acid ion concentration in the aqueous dispersion is preferably 0.005–1 mole/liter, and especially 0.01–0.5 mole/liter. This concentration range for the maleic acid ion can be achieved by adding at 0.06–11.6 wt % (more preferably 0.1–5.8 wt %) as maleic acid.

If the maleic acid ion concentration is less than 0.005 mole/liter, the polishing rate may be inadequate particularly for copper films and barrier metal films. On the other hand, if the maleic acid ion concentration is greater than 1 mole/liter the polishing surface may undergo corrosion, and it may not be possible to obtain a satisfactory finished surface with high precision. The maleic acid ion concentration may be measured by ion chromatography.

The potassium ion concentration may be any appropriate concentration, and is preferably 0.01–2 moles/liter and more preferably 0.02–1 mole/liter. In this case, a potassium ion concentration of less than 0.01 mole/liter may make it impossible to exhibit a sufficient improving effect on the polishing rate, while a concentration of over 2 moles/liter can tend to result in scratches.

The aqueous dispersion described in claims 1 to 7 preferably contains an oxidizing agent. Adding an oxidizing agent improves the polishing rate.

A wide variety of oxidizing agents may be used, and appropriate oxidizing agents include oxidizing metal salts, oxidizing metal chelates, non-metallic oxidizing agents such as peracetic acid and periodic acid, iron-based ions of nitrates, sulfates, EDTA, citrates, potassium ferricyanides and the like, aluminum salts, sodium salts, potassium salts, ammonium salts, quaternary ammonium salts, phosphonium salts, or other cationic salts of peroxides, chlorates, perchlorates, nitrates, permanganates, persulfates, and mixtures thereof.

The "oxidizing agent" used is most preferably hydrogen peroxide. Hydrogen peroxide dissociates at least partially in aqueous dispersions, producing hydrogen peroxide ion. "Hydrogen peroxide" includes hydrogen peroxide molecule as well as the aforementioned hydrogen peroxide ion.

The hydrogen peroxide ion concentration may be set as desired within a range of 0.01–5.0 wt %, but is preferably from 0.05–3.0 wt %, and most preferably 0.07–1.0 wt %. If the hydrogen peroxide concentration is less than 0.01 wt % it may not be possible to achieve polishing at an adequate rate, and if it exceeds 5.0 wt % the polishing surface may undergo corrosion.

The aqueous dispersion of the invention may also contain a polyvalent metal ion with the effect of promoting the function of the hydrogen peroxide as an oxidizing agent, and can thus further improve the polishing rate.

As polyvalent metal ions there may be mentioned metal ions such as aluminum, titanium, vanadium, chromium, manganese, iron, cobalt, nickel, copper, zinc, germanium, zirconium, molybdenum, tin, antimony, tantalum, tungsten, lead and cerium. Any one of these may be used, or two or more polyvalent metal ions may be used in combination.

The polyvalent metal ion content may be up to 3000 ppm, and preferably from 10–2000 ppm, in the aqueous dispersion.

The polyvalent metal ion may be produced by mixing with the aqueous medium a salt such as a nitrate, sulfate or acetate or a chelate containing a polyvalent metal element, and it may also be produced by mixing an oxide of a polyvalent metal element. There may also be used a compound that produces a monovalent metal ion when mixed with the aqueous medium, but whose ion becomes a polyvalent metal ion by the oxidizing agent. Of these various salts and chelates, iron nitrate is preferred because of its particularly excellent effect of improving the polishing rate.

The pH of the aqueous dispersion of claims 1 to 7 is preferably adjusted to the range of 7–11, more preferably 8–11, even more preferably 8.5–10.5 and especially 9–10. The pH adjustment may be accomplished with an acid such as nitric acid or sulfuric acid, or with an alkali such as potassium hydroxide, sodium hydroxide or ammonium. If the pH of the aqueous dispersion is below 7, the etching effect on working films of copper or the like is stronger, thus tending to produce more dishing and erosion. On the other hand, if the pH is above 11 the insulating film is excessively polished, and a satisfactory wiring pattern cannot be obtained.

An aqueous dispersion as described in claims 8 to 16 contains a "heterocyclic compound". As heterocyclic compounds there may be used compounds such as (1) quinolinecarboxylic acids such as 2-quinolinecarboxylic acid (quinaldinic acid), (2) indolizines such as 7-hydroxy-5-methyl-1,3,4-triazaindolizine and (3) compounds with heteropentacycles such as benzotriazole, benzothiazole and benzothiadiazole, as well as (4) compounds with heterohexacycles such as diazine and triazine. Derivatives of these heterocyclic compounds may also be used, bonded with amino groups, mercapto groups, short-chain alkyl groups of 1–3 carbons, and the like.

As derivatives of compounds with heteropentacycles there may be mentioned 2-aminobenzothiazole, 2-amino-6-methylbenzothiazole, 2-mercaptobenzothiazole, 4-amino-1,2,4-triazole, 4-amino-3-hydrazino-5-mercapto-1,2,4-triazole, 3-mercapto-1,2,4-triazole and 3-mercapto-4-methyl-4H-1,2,4-triazole, 5-amino-1H-tetrazole, 2-mercaptothiazoline, guanine, 1-phenyl-5-mercapto-1H-tetrazole, 1H-tetrazole, 1H-tetrazole-1-acetic acid, 1-(2-dimethylaminoethyl)-5-mercaptotetrazole, 4,5-dicyanoimidazole, 2-amino-4,5-dicyano-1H-imidazole and 3H-1,2,3-triazolo[4,5-b]pyridin-3-ol.

As derivatives of compounds with heterohexacycles there may be mentioned 3-amino-5,6-dimethyl-1,2,4-triazine, 2,4-diamino-6-diallylamino-1,3,5-triazine, benzoguanamine, thiocyanuric acid, melamine, 3-amino-5,6-dimethyl-1,2,4-triazine, phthalazine and 2,3-dicyano-5-methylpyrazine.

As heterocyclic compounds there may also be used derivatives of compounds with a heteropentacycle and a heterohexacycle. Such derivatives include adenine and guanine.

As a heterocyclic compound for aqueous dispersion (a) it is preferred to use either or both quinaldinic acid or 7-hydroxy-5-methyl-1,3,4-triazaindolizine. For aqueous dispersion (b), benzotriazole is particularly preferred. For aqueous dispersion (c) it is preferred to use at least one from among benzotriazole, quinaldinic acid and 7-hydroxy-5-methyl-1,3,4-triazaindolizine.

The content of the heterocyclic compound may be 0.0001–5 wt % with respect to 100 wt % of the aqueous dispersion. The content for aqueous dispersions (a) and (c) is preferably 0.001–1 wt %, and more preferably 0.01–0.5 wt %. For aqueous dispersion (b), it is preferably 0.001–0.5 wt %, and more preferably 0.01–0.05 wt %. If the heterocyclic compound content is less than 0.0001 wt % it may not be possible to polish the copper film and barrier metal film at an adequate rate, and a longer time may be required for polishing, especially when the aqueous dispersion is used for polishing of a barrier metal film. Including the heterocyclic compound at 5 wt % can give an adequate effect, and there is no need to increase the content above this.

An aqueous dispersion as described in claims 8 to 16 contains an "organic acid". There is no restriction on the type of organic acid, and a wide range of organic acids may be used such as monobasic acids, dibasic acids, hydroxyl acids and carboxylate acids. Of these organic acids, those with 2 or more carboxyl groups per molecule are preferred. As such organic acids there may be mentioned (1) saturated acids such as oxalic acid, malonic acid, succinic acid, glutaric acid and adipic acid, (2) unsaturated acids such as maleic acid and fumaric acid, (3) aromatic acids such as phthalic acid and (4) hydroxyl acids such as lactic acid, malic acid, tartaric acid and citric acid. Preferred among these organic acids are malonic acid, succinic acid, maleic acid, lactic acid and citric acid.

The content of the organic acid in an aqueous dispersion according to claims 8 to 16 may be 0.01–10 wt %, especially 0.1–5 wt %, and more preferably 0.3–3 wt %, with respect to 100 wt % of the aqueous dispersion. If the organic acid content is less than 0.01 wt %, it may not be possible to polish copper films and barrier metal films at an adequate rate, and the stability of the aqueous dispersion is reduced. Adding the organic acid at 5 wt % sufficiently improves the polishing rate, and there is no need to increase the content above this.

The content also includes cases where a portion of the organic acid is present in ion form. That is, it is the amount thereof included in the dispersion.

An aqueous dispersion as described in claims 8 to 16 also contains an "oxidizing agent". As oxidizing agents there may be used (1) persulfates such as ammonium persulfate and potassium persulfate, (2) hydrogen peroxide, (3) inorganic acids such as nitric acid and sulfuric acid, (4) organic peroxides such as peracetic acid, perbenzoic acid and tert-butylhydroperoxide, and (5) polyvalent metal salts including permanganic acid compounds such as potassium permanganate and dichromic acid compounds such as potassium dichromate. Particularly preferred as oxidizing agents are hydrogen peroxide, persulfates such as potassium persulfate and ammonium persulfate, and inorganic acids such as nitric acid and sulfuric acid. Persulfates can improve the polishing rates of both copper films and barrier metal films, and can be suitably used regardless of the degree of polishing of the copper film in the first stage of polishing.

The oxidizing agent content may be 0.01–10 wt %, preferably 0.05–5 wt % and more preferably 0.1–3 wt %, with respect to 100 wt % of the aqueous dispersion. If the oxidizing agent content is less than 0.01 wt %, it may not be possible to polish the copper film and barrier metal film at an adequate rate, and a longer time may be required when the aqueous dispersion is used for polishing of a barrier metal film. Adding the oxidizing agent at 10 wt % sufficiently improves the polishing rate, and there is no need to increase the content above this.

An aqueous dispersion as described in claims 8 to 16 may also contain a "surfactant". As surfactants there may be used cationic surfactants, anionic surfactants or non-ionic surfactants. Anionic surfactants are particularly preferred, and as anionic surfactants there may be mentioned (1) carboxylates such as fatty acid soaps and alkylether carboxylates, (2) sulfonates such as alkylbenzenesulfonates, alkylnaphthalenesulfonates and α-olefinsulfonates, (3) sulfate esters such as higher alcohol sulfate esters, alkylether sulfates and polyoxyethylene alkylphenylether sulfates, and (4) phosphate esters such as alkylphosphate esters. Preferred among these anionic surfactants are sulfonates, with potassium dodecylbenzenesulfonate and and ammonium dodecylbenzenesulfonate being particularly preferred.

The surfactant content for aqueous dispersions (a) and (b) may be 0.0001–5 wt %, especially 0.001–0.5 wt % and more preferably 0.01–0.2 wt % with respect to 100 wt % of the aqueous dispersion. The content is preferably not less than 0.0001 wt % because the polishing rate may not be adequately improved. On the other hand, it is preferably not over 5 wt % because the polishing rate may be considerably reduced particularly for copper. For aqueous dispersion (c), a surfactant may be added at less than 0.0001 wt %, but addition of a surfactant can lower the polishing rate for insulating films, and therefore it is preferred not to use a surfactant.

The pH of an aqueous dispersion as described in claims 8 to 16 may be from 5 to below 8.5 for aqueous dispersion (a), and is preferably 6 to below 8 and more preferably 6.5 to below 8. With a pH within this range, the barrier metal film is polished at a sufficient rate while polishing of the insulating film is minimized so that excessive polishing of the insulating film does not occur. On the other hand, the pH for aqueous dispersions (b) and (c) may be 8.5 to 12, preferably 8.5 to 11 and more preferably 8.5 to 10. With a pH within this range, the barrier metal film is polished at a sufficient rate. In particular, aqueous dispersion (c) with a pH adjusted to within this range accomplishes polishing of barrier metal films at a sufficient rate as well as suitable polishing of insulating films, it is therefore useful as an aqueous dispersion for a third stage of polishing.

Polishing of a working film for a semiconductor device can be accomplished with a commercially available chemical mechanical polishing apparatus (such as Model "LGP510" or "LGP552" by Lap master SFT Co., Ltd.; Model "EPO-112", "EPO-113" and "EPO-222" by Ebara Laboratories Co., Ltd.; Model "Mirra" by Applied Materials Corp.; and Model "AVANTI-472" by Aipec Corp.). For the polishing, it is preferred for the abrasive remaining on the polishing surface to be removed after polishing. The abrasive may be removed by a common washing method. When the abrasive consists of organic particles, the polishing surface may be heated to high temperature in the presence of oxygen to burn off the particles for their removal. The burning method used may be an ashing treatment method with plasma whereby particles are exposed to the oxygen plasma, oxygen radicals are supplied in a downflow, or the like; this allows the residual organic particles to be easily removed from the polishing surface.

[Embodiments of the Invention]

The present invention will now be explained in greater detail by way of examples.

[1] Preparation of Aqueous Dispersions Containing Abrasive (1) Preparation of Aqueous Dispersions Containing Inorganic Particles

SYNTHESIS EXAMPLE 1

[Preparation of Aqueous Dispersions Containing Fumed Silica or Fumed Alumina]

After placing 100 g of fumed silica particles (product name: "Aerosil #90", Nippon Aerosil Co., Ltd.) and fumed alumina particles (product name: "Aluminum Oxide C", Degusa Corp.) in a 2-liter volume polyethylene bottle, ion-exchanged water was charged in to an amount giving a total of 1000 g. The particles were then dispersed with an ultrasonic disperser to prepare aqueous dispersion (A1a) containing 10 parts by weight (hereunder referred to as "parts") of fumed silica particles and aqueous dispersion (A1b) containing 10 parts of fumed alumina particles.

SYNTHESIS EXAMPLE 2

[Preparation of Aqueous Dispersions Containing Colloidal Silica]

After loading 70 g of ammonia water at a 25 wt % concentration, 40 g of ion-exchanged water, 175 g of ethanol and 21 g of tetraethoxysilane into a 2-liter volume flask, the mixture was heated to 60° C. while stirring at 180 rpm, and after continuing the stirring at this temperature for 2 hours, the mixture was cooled to obtain a colloidal silica/alcohol dispersion with a mean particle size of 230 nm. An evaporator was then used for several repetitions of a procedure in which the alcohol portion was removed while adding ion-exchanged water to the dispersion at a temperature of 80° C., and the alcohol in the dispersion was thereby removed to prepare aqueous dispersion (A2a) with a solid content of 8 wt %.

Aqueous dispersion (A2b) containing silica particles with a mean particle size of 30 nm was prepared in the same manner as above except that 35 g of ethanol was used and 15 g of tetraethoxysilane was used.

Aqueous dispersion (A2c) containing silica particles with a mean particle size of 15 nm was prepared in the same manner as above except that 45 g of ethanol was used and 25 g of tetraethoxysilane was used.

(2) Preparation of Aqueous Dispersions Containing Abrasive Composed of Composite Particles

SYNTHESIS EXAMPLE 3

[Preparation of Aqueous Dispersion Containing Composite Particles Consisting of Polymethyl Methacrylate Particles and Silica Particles]

1) Production of Aqueous Dispersion Containing Polymer Particles

After charging 90 parts of methyl methacrylate, 5 parts of methoxypolyethyleneglycol methacrylate (trade name: "NK Ester M-90G", #400, product of Shinnakamura Chemical Industries Co., Ltd.), 5 parts of 4-vinylpyridine, 2 parts of an azo-based polymerization initiator (trade name "V50", product of Wako Junyaku Co., Ltd.) and 400 parts of ion-exchanged water into a 2-liter volume flask, the contents were heated to 70° C. while stirring under a nitrogen gas atmosphere, for 6 hours of polymerization. This yielded an aqueous dispersion containing polymethyl methacrylate-based particles with a mean particle size of 150 nm, having amino group cations and polyethylene glycol chain-bearing functional groups. The polymerization yield was 95%.

2) Production of Aqueous Dispersion Containing Composite Particles

After loading 100 parts of this aqueous dispersion containing 10 wt % polymethyl methacrylate-based particles which was obtained in 1) above into a 2-liter volume flask, 1 part of methyltrimethoxysilane was added and the mixture was stirred at 40° C. for 2 hours. The pH was then adjusted to 2 with nitric acid to obtain aqueous dispersion (i). Also, the pH of an aqueous dispersion containing 10 wt % of colloidal silica particles (product name: "Snowtex O", product of Nissan Chemical Industries Co., Ltd.) was adjusted to 8 with potassium hydroxide to obtain aqueous dispersion (ii). The zeta potential of the polymethyl methacrylate-based particles in aqueous dispersion (i) was +17 mV, and the zeta potential of the silica particles in aqueous dispersion (ii) was −40 mV.

After then gradually adding and mixing 50 parts of aqueous dispersion (ii) to 100 parts of aqueous dispersion (i) over a period of 2 hours and stirring for 2 hours, there was obtained an aqueous dispersion containing particles consisting of silica particles adhered to the polymethyl methacrylate-based particles. Next, 2 parts of vinyltriethoxysilane was added to this aqueous dispersion, and after stirring for one hour, 1 part of tetraethoxysilane was added, and the mixture was heated to 60° C. and then continually stirred for 3 hours and cooled to obtain aqueous dispersion (A3) containing composite particles. The mean particle size of the composite particles was 180 nm, and the silica particles were adhered to 80% of the surface of the polymethyl methacrylate-based particles.

[2] Preparation and Evaluation of Aqueous Dispersions for CMP (1)

EXAMPLE 1

Aqueous dispersion (A1a) containing fumed silica prepared in Synthesis Example 1 was mixed with ion-exchanged water to 5 parts of fumed silica and to 1 wt % and 0.1 wt % concentrations of potassium maleate and hydrogen peroxide, respectively, and the pH was adjusted to 9.5 with potassium hydroxide to obtain an aqueous dispersion for CMP.

EXAMPLES 2–9

Aqueous dispersions for CMP having specific pH values were obtained in the same manner as Example 1 except that the abrasive types and mixing contents, as well as the mixing contents of potassium maleate and hydrogen peroxide, were changed as shown in Table 1.

COMPARATIVE EXAMPLE 1

An aqueous dispersion for CMP having a specific pH was obtained in the same manner as Example 1, except that no polishing rate adjusting component was added.

COMPARATIVE EXAMPLES 2–6

Aqueous dispersions for CMP having specific pH values were obtained in the same manner as Example 1 except that the abrasive types and mixing contents, the polishing rate adjusting component types and mixing contents, and the mixing content of hydrogen peroxide, were changed as shown in Table 2. In Comparative Example 5, however, nitric acid was used instead of potassium hydroxide for adjustment to the specific pH.

The aqueous dispersions for CMP of Examples 1–9 and Comparative Examples 1–6 were used for polishing of an 8-inch copper film-coated wafer, an 8-inch tantalum film-coated wafer, an 8-inch tantalum nitride film-coated wafer and an 8-inch plasma TEOS film-coated wafer.

A Model "LGP-510" by Lapmaster Corp. was used as the polishing apparatus to polish films formed on each wafer under the following conditions, and the polishing rate was calculated according to the formula given below.

Table rotation speed: 50 rpm

Head rotation speed: 50 rpm

Polishing pressure: 300 g/cm$^2$

Aqueous dispersion supply rate: 100 ml/min.

Polishing time: 1 min.

Polishing pad: Two-layer structure of Product No. IC1000/SUBA400, by Rodel-Nitta Co., Ltd.

Polishing rate (Å/min)=[(thickness of film before polishing)−(thickness of film after polishing)]/polishing time.

The thickness of each of the copper, tantalum and tantalum nitride films was determined by measuring the sheet resistance by the direct current 4-probe method using a resistivity measuring instrument (Model "Z-5" by NPS Corp.), and calculating the thickness from the sheet resistance value and the copper or tantalum resistivity based on the following formula.

Thickness (Å) of copper, tantalum or tantalum nitride film=[copper, tantalum or tantalum nitride resistivity ($\Omega$/cm)/sheet resistance value ($\Omega$/cm$^2$)]×10$^{-8}$ The thickness of the insulating film was measured with an interference film thickness probe (Model "FTP500" by Sentech Corp.).

Scratches on the copper film were evaluated by irradiating the sample with a spotlight in a dark room and visually observing the presence of any scratches.

Scratches on the insulating film were evaluated by photographing with a differential interference microscope and counting the number of scratches in a visual field of 100 $\mu$m×100 $\mu$m.

The results are shown in Tables 1 and 2.

TABLE 1

| | | Examples | | | | | | | | |
|---|---|---|---|---|---|---|---|---|---|---|
| | | 1 | 2 | 3 | 4 | 5 | 6 | 7 | 8 | 9 |
| abrasive | types | fumed silica | | colloidal silica(230 nm) | composite particle | | composite particle/ fumed silica | fumed silica | | |
| | aqueous dispersion | A1a | | A2a | A3 | | A3/A1a | A1a | | |
| | contents (parts) | 5 | 10 | 5 | 5 | 10 | 5/1 | 5 | 5 | 5 |
| polishing rate adjusting component | types | | | | potassium maleate | | | | | |
| | contents (parts) | 1 | 1 | 1 | 1 | 1 | 1 | 1 | 3 | 1 |
| hydrogen peroxide | contents (parts) | 0.1 | 0.1 | 0.1 | 0.1 | 0.1 | 0.1 | 3 | 0.1 | 0.1 |
| pH | | 9.5 | 9.5 | 9.5 | 9.5 | 9.5 | 9.5 | 9.5 | 9.5 | 9 |
| polishing rate (Å/min) | Cu | 650 | 720 | 630 | 600 | 1210 | 1000 | 820 | 830 | 700 |
| | Ta | 720 | 750 | 700 | 480 | 1150 | 990 | 790 | 810 | 750 |
| | TaN | 500 | 520 | 500 | 480 | 1090 | 970 | 610 | 550 | 520 |
| | insulating film | 840 | 1020 | 840 | 670 | 1150 | 1110 | 810 | 600 | 780 |
| polishing rate ratio | Cu/Ta | 1.11 | 1.04 | 1.11 | 0.80 | 0.95 | 0.99 | 0.96 | 0.98 | 1.07 |
| | Cu/TaN | 0.77 | 0.72 | 0.95 | 0.80 | 0.90 | 0.97 | 0.74 | 0.66 | 0.74 |
| | Cu/insulating film | 1.29 | 1.42 | 1.33 | 1.12 | 0.96 | 1.11 | 0.99 | 0.72 | 1.11 |
| scratches on the copper film | | none | none | none | none | none | none | none | none | none |
| scratches on the insulating film [number/(100 μm × 100 μm)] | | 5 | 7 | 3 | 0 | 1 | 0 | 6 | 6 | 7 |

TABLE 2

| | | Comparative Examples | | | | | |
|---|---|---|---|---|---|---|---|
| | | 1 | 2 | 3 | 4 | 5 | 6 |
| abrasive | types | fumed silica | | | fumed alumina | fumed silica | |
| | aqueous dispersion | A1a | | | A1b | A1a | |
| | contents(parts) | 5 | 10 | 5 | 5 | 5 | 5 |
| polishing rate adjusting component | types | — | ammonia | glycine | ethylamine | alanine | ammonia |
| | contents(parts) | — | 1 | 10 | 1 | 1 | 0.5 |
| hydrogen peroxide | contents (parts) | 0.1 | 0.1 | 0 | 0.02 | 0.1 | 0.5 |
| pH | | 9.5 | 9.5 | 9.5 | 9.5 | 3 | 8.5 |
| polishing rate (Å/min) | Cu | 22 | 2540 | 250 | 1500 | 30 | 5000 |
| | Ta | 10 | 50 | 25 | 50 | 25 | 50 |
| | TaN | 5 | 30 | 5 | 15 | 15 | 50 |
| | insulating film | 90 | 310 | 330 | 110 | 80 | 100 |
| polishing rate ratio | Cu/Ta | 0.45 | 0.02 | 0.10 | 0.03 | 0.83 | 0.01 |
| | Cu/TaN | 0.23 | 0.01 | 0.02 | 0.01 | 0.50 | 0.01 |
| | Cu/insulating film | 4.09 | 0.12 | 1.32 | 0.07 | 2.67 | 0.02 |
| scratches on the copper film | | exist | exist | exist | exist | exist | exist |
| scratches on the insulating film [number/(100 μm × 100 μm)] | | 150 | 90 | 110 | 350 | 130 | 130 |

According to the results shown in Table 1, the aqueous dispersions of Examples 1–9 containing 1–3 parts of potassium maleate and 0.1–3 parts of hydrogen peroxide all had copper film and tantalum film and/or tantalum nitride film polishing rate ratios ($R_{Cu}/R_{BM}$) and copper film and insulating film polishing rate ratios ($R_{Cu}/R_{In}$) in the range of 0.5–2. Particularly, Examples 4 to 6 which used composite particles or mixtures of composite particles and fumed silica as the abrasive had $R_{Cu}/R_{BM}$ and $R_{Cu}/R_{In}$ ratios in the range of 0.8–1.2, and exhibited very few scratches of the copper film and insulating film, while giving finished surfaces with sufficient flatness and high precision.

According to the results shown in Table 2, Comparative Examples 1–5 had either very large or very small copper film and tantalum film and/or tantalum nitride film polishing rate ratios ($R_{Cu}/R_{BM}$) and copper film and insulating film polishing rate ratios ($R_{Cu}/R_{In}$), and exhibited finished surfaces with insufficient flatness.

In Comparative Example 6 which used a first-stage aqueous dispersion with $R_{Cu}/R_{BM}$=100, the copper film polishing rate $R_{Cu}$ was high, but the copper film and tantalum film and/or tantalum nitride film polishing rate ratio ($R_{Cu}/R_{BM}$) and the copper film and insulating film polishing rate ratio ($R_{Cu}/R_{In}$) were both small, and sufficient flatness could not be achieved for the finished surface.

EXAMPLE 10

On the surface of a silicon substrate there was laminated an insulating film bearing a pattern formed by grooves with a depth of 1 μm and different widths of 5 μm, 10 μm, 25 μm, 50 μm, 75 μm and 100 μm. A 300 Å TaN film was then formed on the surface of the insulating film, and then copper was accumulated to 1.3 μm by sputtering and plating in the grooves covered with the TaN film, to fabricate a wafer.

A Model "LGP-510" by Lapmaster SFT Co., Ltd. was used as the polishing apparatus for two-stage polishing of the fabricated wafer under the following conditions. In the first stage of polishing, however, a fumed silica-based aqueous dispersion ($R_{Cu}/R_{BM}$=30) was used as the aqueous dispersion for 3 minutes of polishing, after which a second stage of polishing was carried out using the same aqueous dispersion as Example 5, until the remaining copper and TaN were completely removed.

Table rotation speed: 50 rpm
Head rotation speed: 50 rpm
Polishing pressure: 300 g/cm²
Aqueous dispersion supply rate: 100 ml/min.
Polishing pad: Two-layer structure of Product No. IC1000/SUBA400, by Rodel-Nitta Co., Ltd.

After the polishing, a surface roughness meter (Model "P-10" by KLA-Tencor Corp.) was used to measure the dishing in the 100 μm-width copper wiring, which was found to be 450 Å.

EXAMPLE 11

Two-stage polishing was carried out in the same manner as Example 10 except for using the same aqueous dispersion used in Example 6 as the aqueous dispersion for the second stage of polishing; the dishing of a 100 μm copper wiring was measured.

The dishing of the 100 μm copper wiring after completion of polishing was 470 Å.

COMPARATIVE EXAMPLE 7

Two-stage polishing was carried out in the same manner as Example 10 except for using the same aqueous dispersion used in Comparative Example 3 as the aqueous dispersion for the second stage of polishing; the dishing of a 100 μm copper wiring was measured.

The dishing of the 100 μm copper wiring after completion of polishing was 3500 Å.

Examples 10 and 11 obtained by the polishing process of the invention produced less than 500 Å of dishing in a 100 μm copper wiring after completion of polishing, and the finished surfaces obtained were sufficiently flattened and highly precise. Comparative Example 7, however, had large dishing of 3500 Å in a 100 μm copper wiring after completion of polishing, and the finished surface was insufficiently flattened.

[3] Preparation and Evaluation of Aqueous Dispersions for CMP (2)

EXAMPLES 12–24

Prescribed amounts of the aqueous dispersions prepared in Synthesis Examples 1 to 3 were each charged into a 1-liter volume polyethylene bottle, and the heterocyclic compounds and organic acids listed in Tables 3 to 5 were added to the contents also listed in Tables 3 to 5 and thoroughly mixed therewith. Aqueous solutions of the oxidizing agents and surfactants listed in Tables 3 to 5 were then added to the contents listed in Tables 3 to 5 while stirring (where Examples 21–24 in Table 5 were compositions containing no surfactant). Next, an aqueous potassium hydroxide solution or ammonia water was added to adjust the pH to the values listed in Tables 3 to 5, after which ion-exchanged water was added and the solutions were filtered with a 5 μm pore filter to obtain aqueous dispersions for CMP for Examples 12 to 24.

The "HMT" in Tables 4 and 5 represents 7-hydroxy-5-methyl-1,3,4-triazaindolizine.

The aqueous dispersions of Examples 12 to 24 were used for polishing of an 8-inch copper film-coated wafer (represented as "Cu" in Tables 3–5), an 8-inch tantalum film-coated wafer (represented as "Ta" in Tables 3–5), an 8-inch plasma TEOS film-coated wafer (represented as "PETEOS" in Tables 3–5) and an 8-inch silsesquioxane film-coated wafer (represented as "low-k" in Tables 3–5). The polishing apparatus and polishing conditions employed were as follows.

Polishing apparatus: Model "LGP510" by Lapmaster SFT Corp.
Polishing pad: Product name: "IC1000-050-(603)-(P)-S400J", by Rodel Corp. (U.S.)
Carrier load: 300 g/cm²
Carrier rotation speed: 80 rpm
Table rotation speed: 100 rpm
Aqueous dispersion supply rate: 200 ml/min.
Polishing time: 3 minutes

TABLE 3

| | | Examples | | | |
| --- | --- | --- | --- | --- | --- |
| | | 12 | 13 | 14 | 15 |
| abrasive | types | colloidal silica (30 nm) | fumed silica | composite particle | colloidal silica (15 nm) |
| | aqueous dispersion | A2b | A1a | A3 | A2c |
| | contents (wt %) | 1 | 1.2 | 3 | 1.5 |
| heterocyclic compound | types | benzotriazole | | | |
| | contents (wt %) | 0.02 | | 0.01 | 0.02 |
| organic acid | types | maleic acid | | malonic acid | succinic acid |
| | contents (wt %) | 1 | | 1.5 | 1 |
| oxidizing agent | types | hydrogen peroxide | | potassium persulfate | |
| | contents (wt %) | 1 | | 0.5 | 1 |
| surfactant | types | potassium dodecylbenzenesulfonate | | | |
| | contents (wt %) | 0.05 | | 0.03 | 0.02 |
| pH | | 9.5 | 9.2 | 8.7 | 9.0 |
| polishing rate (Å/min) | Cu | 55 | 65 | 35 | 40 |
| | Ta | 1320 | 1330 | 1160 | 1310 |
| | PETEOS | 45 | 55 | 25 | 30 |
| | low-k | 35 | 30 | 10 | 20 |
| polishing rate ratio | Cu/Ta | 0.042 | 0.049 | 0.030 | 0.031 |
| | PETEOS/Ta | 0.034 | 0.041 | 0.022 | 0.023 |
| | low-k/Ta | 0.027 | 0.023 | 0.0009 | 0.015 |

TABLE 4

| | | Examples | | | | |
|---|---|---|---|---|---|---|
| | | 16 | 17 | 18 | 19 | 20 |
| abrasive | types | colloidal silica (30 nm) | fumed silica | colloidal silica (30 nm) | | composite particle |
| | aqueous dispersion | A2b | A1a | A2b | | A3 |
| | contents (wt %) | 1 | 1.2 | 1 | | 2.2 |
| heterocyclic compound | types | HMT | quinaldinic acid | HMT | | |
| | contents (wt %) | 0.1 | 0.2 | 0.1 | | 0.2 |
| organic acid | types | maleic acid | succinic acid | maleic acid | | |
| | contents (wt %) | 1 | 1.5 | 1 | | |
| oxidizing agent | types | hydrogen peroxide | potassium persulfate | hydrogen peroxide | | |
| | contents (wt %) | 1 | 1.5 | 1 | | |
| surfactant | types | | potassium dodecylbenzenesulfonate | | | |
| | contents (wt %) | | 0.05 | | | |
| pH | | 7.0 | 7.4 | 7.3 | 7.8 | 7.8 |
| polishing rate (Å/min) | Cu | 1140 | 625 | 750 | 225 | 335 |
| | Ta | 610 | 605 | 550 | 615 | 605 |
| | PETEOS | 35 | 45 | 55 | 50 | 25 |
| | low-k | 30 | 20 | 45 | 30 | 35 |
| polishing rate ratio | Cu/Ta | 1.869 | 1.033 | 1.364 | 0.366 | 0.554 |
| | PETEOS/Ta | 0.057 | 0.074 | 0.100 | 0.081 | 0.041 |
| | low-k/Ta | 0.049 | 0.033 | 0.082 | 0.049 | 0.058 |

TABLE 5

| | | Examples | | | |
|---|---|---|---|---|---|
| | | 21 | 22 | 23 | 24 |
| abrasive | types | colloidal silica (30 nm) | | composite particle | fumed silica |
| | aqueous dispersion | A2b | | A3 | A1a |
| | contents (wt %) | 5 | 6.5 | 7.5 | 5 |
| heterocyclic compound | types | benzotriazole | | HMT | quinaldinic acid |
| | contents (wt %) | 0.02 | 0.03 | 0.2 | 0.25 |
| organic acid | types | maleic acid | malonic acid | maleic acid | |
| | contents (wt %) | 1 | 2 | 1.5 | 1 |
| oxidizing agent | types | hydrogen peroxide | potassium persulfate | | hydrogen peroxide |
| | contents (wt %) | 1 | | 2 | 1 |
| surfactant | types | | | — | |
| | contents (wt %) | | | — | |
| pH | | 9.5 | 10.2 | 9.8 | 9.4 |
| polishing rate (Å/min) | Cu | 5 | 15 | 10 | 15 |
| | Ta | 1340 | 1320 | 1030 | 1220 |
| | PETEOS | 755 | 635 | 595 | 725 |
| | low-k | 650 | 590 | 605 | 685 |
| polishing rate ratio | Cu/Ta | 0.004 | 0.011 | 0.010 | 0.012 |
| | PETEOS/Ta | 0.563 | 0.481 | 0.578 | 0.594 |
| | low-k/Ta | 0.485 | 0.447 | 0.587 | 0.561 |

The polishing rate was calculated according to the following formula. The results are shown in Tables 3 to 5.

Polishing rate (Å/min)=[(thickness of film before polishing)−(thickness of film after polishing)/polishing time]

The thickness of each of the copper and tantalum films was determined by measuring the sheet resistance by the direct current 4-probe method using a resistivity measuring instrument (Model "Z-5" by NPS Corp.), and calculating the thickness from the sheet resistance value and the copper or tantalum resistivity based on the following formula.

Thickness (Å) of copper or tantalum film=[copper or tantalum resistivity (Ω/cm)/sheet resistance value (Ω/cm$^2$)]×10$^{-8}$ The thickness of the insulating film was measured with an interference film thickness probe (Model "FTP500" by Sentech Corp.).

According to the results shown in Tables 3 to 5, the aqueous dispersions of Examples 12 to 24 which contained prescribed amounts of heterocyclic compounds, organic acids and oxidizing agents, with surfactants when necessary, had polishing rate ratios for the copper films, barrier metal films and insulating films that varied across a wide range depending on the composition. It was demonstrated that the types and amounts of heterocyclic compounds, organic acids and oxidizing agents can be changed for optimal adjustment of the aqueous dispersion for the second stage or third state of polishing. It is believed that the aqueous dispersions of Examples 12 to 24 may therefore be used to easily obtain finished surfaces with sufficient flatness and high precision when polishing working films formed on semiconductor substrates.

What is claimed is:
1. A method of forming an embedded wire comprising:
 polishing a film to be polished with a chemical mechanical polishing aqueous dispersion;
 wherein the film to be polished comprises:
  an insulating film having a recessed portion, formed on a semiconductor wafer,
  a barrier metal film formed on the insulating film, and a copper film comprising pure copper or a copper alloy containing at least 95 wt. % copper, formed on the barrier metal film, so that at least a portion of the copper or copper alloy of the copper film fills the recessed portion of the insulating film;

wherein the chemical mechanical polishing aqueous dispersion comprises:
an abrasive,
water, and
an organic acid; and wherein said polishing has a rate for polishing the copper film ($R_{Cu}$), a rate for polishing the barrier metal film ($R_{BM}$), and a rate for polishing the insulating film ($R_{In}$), under the same conditions, such that said polishing is carried under conditions in which:
$0.5 \leq R_{Cu}/R_{BM} \leq 2$, and
$0.5 \leq R_{Cu}/R_{In} \leq 2$.

2. The method of claim 1, wherein the abrasive is inorganic abrasive particles, and the inorganic abrasive particles all have the same composition.

3. The method of claim 1, wherein the barrier metal film comprises tantalum and/or tantalum nitride.

4. The method of claim 1, wherein the abrasive comprises at least one type of abrasive particles selected from the group consisting of inorganic particles, all having the same composition; organic particles; and inorganic/organic composite particles.

5. The method of claim 1, wherein said organic acid is maleic acid at a concentration of 0.005–1 mole/liter.

6. The method of claim 1, wherein the chemical mechanical polishing aqueous dispersion has a pH of 7–11.

7. A method of forming an embedded wire comprising:
polishing a film to be polished with a chemical mechanical polishing aqueous dispersion;
wherein the film to be polished comprises:
an insulating film having a recessed portion, formed on a semiconductor wafer,
a barrier metal film formed on the insulating film, and
a copper film comprising pure copper or a copper alloy containing at least 95 wt. % copper, formed on the barrier metal film, so that at least a portion of the copper or copper alloy of the copper film fills the recessed portion of the insulating film;

wherein the chemical mechanical polishing aqueous dispersion comprises:
an abrasive,
water,
a heterocyclic compound,
an oxidizing agent, and
an organic acid; and wherein said polishing has a rate for polishing the copper film ($R_{Cu}$), a rate for polishing the barrier metal film ($R_{BM}$), and a rate for polishing the insulating film ($R_{In}$), under the same conditions, such that said polishing is carried out under conditions in which:
$0 < R_{Cu}/R_{BM} \leq 5$, and
$0 < R_{In}/R_{BM} \leq 2$.

8. The method of claim 7, wherein the abrasive is inorganic abrasive particles, and the inorganic abrasive particles all have the same composition.

9. The method of claim 7, wherein the chemical mechanical polishing aqueous dispersion further comprises 0.0001–0.1 wt % of a surfactant.

10. The method of claim 7, wherein the chemical mechanical polishing aqueous dispersion has a pH below 8.5, $0.5 < R_{Cu}/R_{BM} \leq 5$, and $0 < R_{In}/R_{BM} \leq 0.1$.

11. The method of claim 10, wherein the heterocyclic compound is quinaldinic acid and/or 7-hydroxy-5-methyl-1,3,4-triazaindolizine.

12. The method of claim 10, wherein the chemical mechanical polishing aqueous dispersion further comprises contains 0.0001–0.1 wt % of a surfactant.

13. The method of claim 7, wherein the chemical mechanical polishing aqueous dispersion has a pH of 8.5 or above, $0 < R_{Cu}/R_{BM} \leq 0.1$, $0 < R_{In}/R_{BM} \leq 0.1$, and the chemical mechanical polishing aqueous dispersion further comprises 0.0001–0.1 wt % of a surfactant.

14. The method of claim 7, wherein the heterocyclic compound is benzotriazole.

15. The method of claim 7, wherein the chemical mechanical polishing aqueous dispersion has a pH of 8.5 or above, $0 < R_{Cu}/R_{BM} \leq 0.05$, and $0.1 < R_{In}/R_{BM} \leq 2$.

16. The method of claim 15, wherein the heterocyclic compound is at least one compound selected from the group consisting of benzotriazole, quinaldinic acid and 7-hydroxy-5-methyl-1,3,4-triazaindolizine.

17. The method of claim 1, wherein prior to said polishing, the film to be polished is subjected to a first polishing step with a first aqueous dispersion for chemical mechanical polishing so that in said first polishing step, $R_{Cu}/R_{BM}$ is 20 or greater.

18. The method of claim 17, wherein the barrier metal film comprises tantalum and/or tantalum nitride, the abrasive comprises at least one type of abrasive particles selected from the group consisting of inorganic particles, all having the same composition; organic particles; and inorganic/organic composite particles, and the organic acid is maleic acid at a concentration of 0.005–1 mole/liter.

19. The method of claim 10, wherein prior to said polishing, the film to be polished is subjected to a first polishing step.

20. The method of claim 19, wherein the heterocyclic compound is quinaldinic acid and/or 7-hydroxy-5-methyl-1,3,4-triazaindolizine.

21. The method of claim 19, wherein the chemical mechanical polishing aqueous dispersion further comprises 0.0001–0.1 wt % of a surfactant.

22. The method of claim 19, wherein the chemical mechanical polishing aqueous dispersion has a pH of 8.5 or above, $0 < R_{Cu}/R_{BM} \leq 0.1$, $0 < R_{In}/R_{BM} \leq 0.1$, and the chemical mechanical polishing aqueous dispersion further comprises 0.0001–0.1 wt % of a surfactant.

23. The method of claim 22, wherein the heterocyclic compound is benzotriazole.

24. The method of claim 19, wherein the chemical mechanical polishing aqueous dispersion has a pH of 8.5 or above, $0 < R_{Cu}/R_{BM} 0.05$, and $0.1 < R_{In}/R_{BM} \leq 2$.

25. The method of claim 24, wherein the heterocyclic comprises at least one compound selected from the group consisting of benzotriazole, quinaldinic acid and 7-hydroxy-5-methyl-1,3,4-triazaindolizine.

26. The method of claim 10, wherein prior to said polishing, the film to be polished is subjected to a first polishing step; and
after said polishing, the film to be polished is subjected to a third polishing step.

27. The method of claim 26, wherein the heterocyclic compound is quinaldinic acid and or 7-hydroxy-5-methyl-1,3,4-triazaindolizine.

28. The method of claim 26, wherein the chemical mechanical polishing aqueous dispersion further comprises 0.0001–0.1 wt %. of a surfactant.

29. The method of claim 13, wherein prior to said polishing the film to be polished is subjected to a first polishing step and a second polishing step.

30. The method of claim 29, wherein the heterocyclic compound is benzotriazole.

31. The method of claim 27, wherein the chemical mechanical polishing aqueous dispersion has a pH of 8.5 or above, $0<R_{Cu}/R_{BM}\leqq0.05$, and $0.1<R_{In}/R_{BM}\leqq2$.

32. The method of claim 31, wherein the heterocyclic compound comprises at least compound selected from the group consisting of benzotriazole, quinaldinic acid and 7-hydroxy-5-methyl-1,3,4-triazaindolizine.

33. The method of claim 1, wherein the chemical polishing aqueous dispersion consists essentially of an abrasive, water, and an organic acid.

* * * * *